United States Patent
Cannon et al.

(10) Patent No.: US 7,875,854 B2
(45) Date of Patent: Jan. 25, 2011

(54) DESIGN STRUCTURE FOR ALPHA PARTICLE SENSOR IN SOI TECHNOLOGY AND STRUCTURE THEREOF

(75) Inventors: Ethan H. Cannon, Essex Junction, VT (US); Michael J. Hauser, Bolton, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 176 days.

(21) Appl. No.: 12/099,307

(22) Filed: Apr. 8, 2008

(65) Prior Publication Data

US 2009/0250622 A1    Oct. 8, 2009

(51) Int. Cl.
*G01T 1/178* (2006.01)
(52) U.S. Cl. .................................. 250/370.02
(58) Field of Classification Search ............ 250/370.01, 250/370.02, 370.05, 370.14
See application file for complete search history.

(56) References Cited

U.S. PATENT DOCUMENTS

| | | | |
|---|---|---|---|
| 4,413,327 A | 11/1983 | Sabo et al. | |
| 4,464,752 A | 8/1984 | Schroeder et al. | |
| 4,931,990 A | 6/1990 | Perkin | |
| 5,022,027 A | 6/1991 | Rosario | |
| 5,331,164 A | 7/1994 | Buehler et al. | |
| 5,604,755 A | 2/1997 | Bertin et al. | |
| 5,705,807 A | 1/1998 | Throngnumchai et al. | |
| 6,275,747 B1 | 8/2001 | Wada et al. | |
| 6,828,561 B2 | 12/2004 | Layman et al. | |
| 6,986,078 B2 | 1/2006 | Rodbell et al. | |
| 6,995,376 B2 | 2/2006 | Cottrell et al. | |
| 7,057,180 B2 | 6/2006 | Fifield et al. | |
| 7,166,847 B2 | 1/2007 | Hannah | |
| 7,271,389 B2 | 9/2007 | August et al. | |
| 7,375,339 B2 | 5/2008 | Abadeer et al. | |
| 7,383,475 B1 * | 6/2008 | Corbin | 714/718 |
| 2001/0022521 A1 * | 9/2001 | Sasaki et al. | 326/113 |
| 2005/0003612 A1 * | 1/2005 | Hackler et al. | 438/257 |
| 2006/0010346 A1 | 1/2006 | Minemier | |
| 2007/0252088 A1 | 11/2007 | Abadeer et al. | |
| 2007/0283193 A1 | 12/2007 | Lewis et al. | |

(Continued)

OTHER PUBLICATIONS

Anathan et al., "Process to Fabricate a Bipolar IC with Reduced Alpha Particle Damage" IBM TDB 05-80, p. 5365-5366, May 1,1980.

(Continued)

*Primary Examiner*—David P Porta
*Assistant Examiner*—Faye Boosalis
(74) *Attorney, Agent, or Firm*—Richard Kotulak; Roberts Mlotkowski Safran & Cole, P.C.

(57) ABSTRACT

The invention relates to a design structure, and more particularly, to a design structure for an alpha particle sensor in SOI technology and a circuit thereof. The structure is a silicon-on-insulator radiation detector which includes: a charge collection node; a precharge transistor that has a source from the charge collection node, a drain at Vdd, and a gate controlled by a precharge signal; an access transistor that has a source from the charge collection node, a drain connecting to a readout node, and a gate controlled by a read-out signal; and a detector pulldown transistor having a drain from the charge collection node, a source to ground, and a grounded gate.

16 Claims, 4 Drawing Sheets

U.S. PATENT DOCUMENTS

2008/0128629 A1    6/2008    Abadeer et al.

OTHER PUBLICATIONS

Coufal et al., "Ferroelectric Detector for Real Time Recording of the Trajectory of Photon, Electron and Other Particle Beams", TBD 09-93, V.36, n9B, p. 431-432, Sep. 1983.

Ziegler, "Orientation of Planar Circuits to Minimize Cosmic Ray Soft-Fails", IBM TBD 07-87, p. 503, Jul. 1, 1987.

U.S. Appl. No. 12/099,304 entitled "Method for Detecting Alpha Particles in SOI Technology", Filed Apr. 8, 2008, First named inventor: Ethan H. Cannon.

Office Action dated Oct. 10, 2008 for related U.S. Appl. No. 12/099,304.

* cited by examiner

DESIGN STRUCTURE FOR ALPHA PARTICLE SENSOR IN SOI TECHNOLOGY AND STRUCTURE THEREOF

CROSS-REFERENCE TO RELATED APPLICATIONS

This application is related to U.S. Ser. No. 12/099,304 filed on the same day and currently pending.

FIELD OF THE INVENTION

The present invention generally relates to a design structure, and more particularly, to and a design structure for alpha particle sensor in SOI technology and a circuit thereof.

BACKGROUND OF THE INVENTION

Ionizing radiation can cause single event upsets (SEUs) in semiconductor ICs. Ionizing radiation can directly upset storage circuits, such as SRAMs, register files and flip-flops. Moreover, radiation events in combinational logic create voltage glitches that can be latched. SEUs may cause the IC to perform incorrect or illegal operations.

Methods to prevent SEUs include adding spatial and/or temporal redundancy, so that a single radiation event cannot cause an SEU. Redundancy solutions incur area, power and performance penalties. Consequently, there is a need to improve detection schemes of radiation events in ICs.

An array of SOI SRAM cells has been proposed to detect alpha particles from neutrons that interact with a neutron conversion layer. Alpha particles hitting the sensitive area of an SRAM cell cause an SEU. While the SEU rate of SRAMs from alpha particles is very large for high reliability applications, the sensitive area of an SRAM cell is a small fraction of the total cell area.

Another SOI ionizing radiation monitor consists of a diode below the buried oxide connected to a circuit, such as a domino circuit. This requires special process steps to form the diode below the BOX. Another SOI radiation detector consists of a PNPN structure in the active device layer and a PN gate. The detector enters a high current latchup state to detect radiation.

Accordingly, there exists a need in the art to overcome the deficiencies and limitations described hereinabove.

SUMMARY OF THE INVENTION

In a first aspect of the invention, a silicon-on-insulator radiation detector comprises: a charge collection node; a precharge transistor that has a source from the charge collection node, a drain at Vdd, and a gate controlled by a precharge signal; an access transistor that has a source from the charge collection node, a drain connecting to a readout node, and a gate controlled by a read-out signal; and a pulldown transistor having a drain from the charge collection node, a source to ground, and a grounded gate.

In embodiments, the silicon-on-insulator radiation detector further comprises a silicon layer formed on an insulating substrate. The silicon layer includes shallow implanted regions that do not extend to the insulating substrate. The pulldown transistor is a multi-finger pulldown transistor.

In another aspect of the invention, a silicon-on-insulator radiation detector comprises: a silicon layer formed on an insulating substrate, wherein the silicon layer includes shallow implanted regions that do not extend to the insulating substrate; a charge collection node; a precharge transistor of a first polarity whose source is the charge collection node, whose drain is at Vdd, and whose gate is controlled by a precharge signal; an access transistor of a second polarity whose source is the charge collection node, whose drain connects to a readout node, and whose gate is controlled by a read-out signal; and a multi-finger pulldown transistor of a second polarity whose drain is the charge collection node, whose source is grounded, and whose gate is grounded.

In a further aspect of the invention, a design structure for an alpha particle sensor in SOI technology is embodied in a machine readable medium for designing, manufacturing, or testing an integrated circuit. The design structure comprises: a charge collection node; a precharge transistor that has a source from the charge collection node, a drain at Vdd, and a gate controlled by a precharge signal; an access transistor that has a source from the charge collection node, a drain connecting to a readout node, and a gate controlled by a read-out signal; and a pulldown transistor having drain from the charge collection node, a source to ground, and a grounded gate.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention generally relates to a design structure, and more particularly, to a design structure for an alpha particle sensor in SOI technology and structure and/or circuit thereof. More specifically, the present invention teaches an SOI radiation sensor cell and design structure thereof. The SOI radiation sensor cell of the present invention includes three transistors: a precharge NFET, a detector pulldown NFET and an access NFET. In embodiments, a reset signal charges an internal node through the precharge device and a radiation event on the detector pulldown device discharges the node. When a Read Enable signal is exercised, the access device writes the node state to the bitline, where high indicates no event and low indicates a radiation event. The SOI radiation sensor does not enter a high current state when it detects radiation and will use less power than the PNPN structure. The SOI radiation sensor is formed by standard processing steps, and is cheaper than the ionizing radiation monitor which requires special processing steps.

Structure/Circuit

Figure 1:
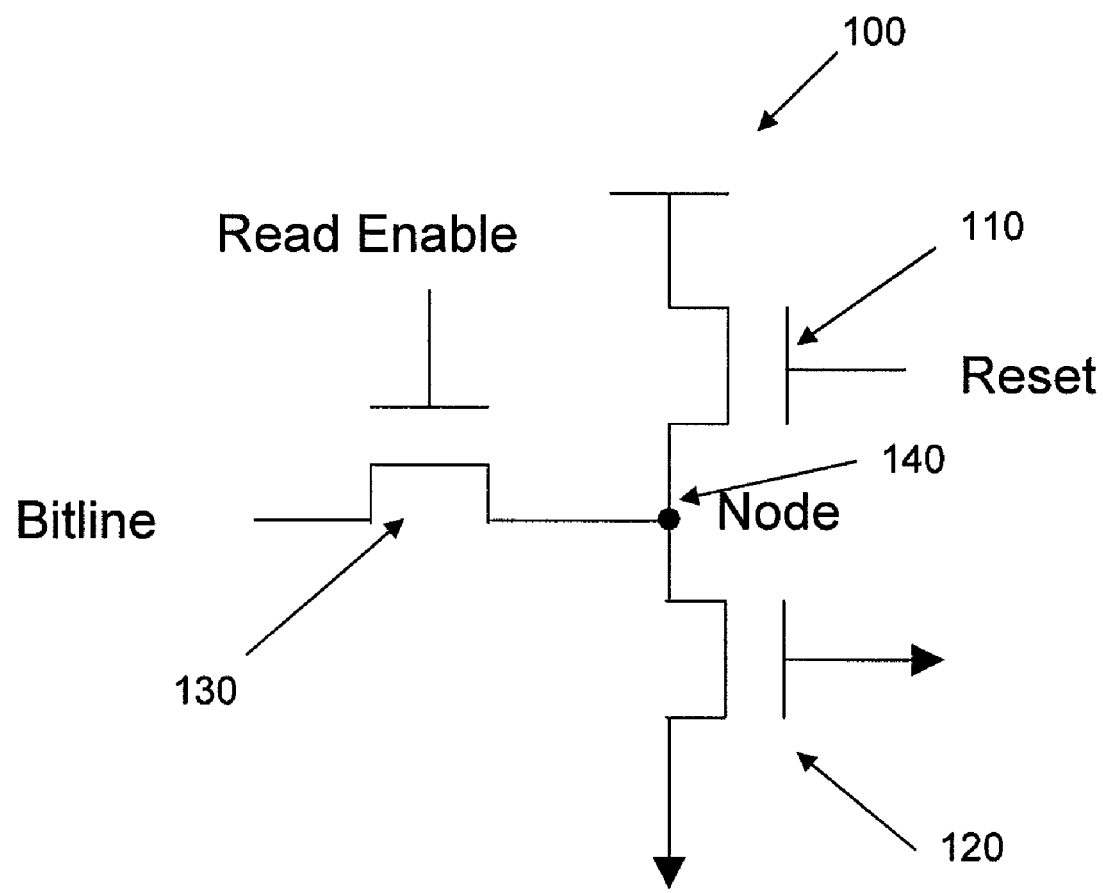
FIG. 1 shows a schematic of an SOI radiation detector in accordance with the invention.

FIG. 1 shows a schematic of a SOI radiation detector in accordance with the invention. In embodiments, the SOI radiation sensor cell 100 of the present invention includes three transistors: a precharge NFET (reset) 110, a detector NFET (detector pulldown device) 120 and an access NFET (access device) 130. An internal node 140 is connected to all of the devices, as discussed below in more detail.

More specifically, the precharge NFET (reset) 110 has a source from the node (charge collection node)140, a drain at Vdd, and a gate controlled by a precharge signal. The access NFET (access device) 130 has a source from the charge collection node 140, a drain connecting to a readout node, and a gate controlled by a read-out signal. The detector pulldown device 120 has a drain from the charge collection node, a source to ground, and a grounded gate.

In embodiments, a reset signal charges the internal node 140 through the precharge device 110. This will charge the node. A radiation event on the detector pulldown device 130 discharges the node; that is, a radiation event will turn the detector pulldown device on which, in turn, discharges the node to ground. When a Read Enable signal is exercised, the access device 130 writes the node state to the bitline, where high indicates no event and low indicates a radiation event. As such, when there is no radiation event, the node 140 remains charged (by the reset) and the output is high; whereas, when there is a radiation event, the node 140 will discharge to ground and the output is low.

To increase the sensitive area in each cell, multiple detector pulldown devices may be connected in parallel, since an event on any detector pulldown device will discharge the node. The sensitive area of the SOI radiation sensor cell comprises a larger fraction of the sensor cell area compared to an SRAM cell, so the SOI radiation sensor will have larger detection efficiency. The SOI radiation sensor does not enter a high current state when it detects radiation and will use less power than the PNPN structure.

Figure 2:
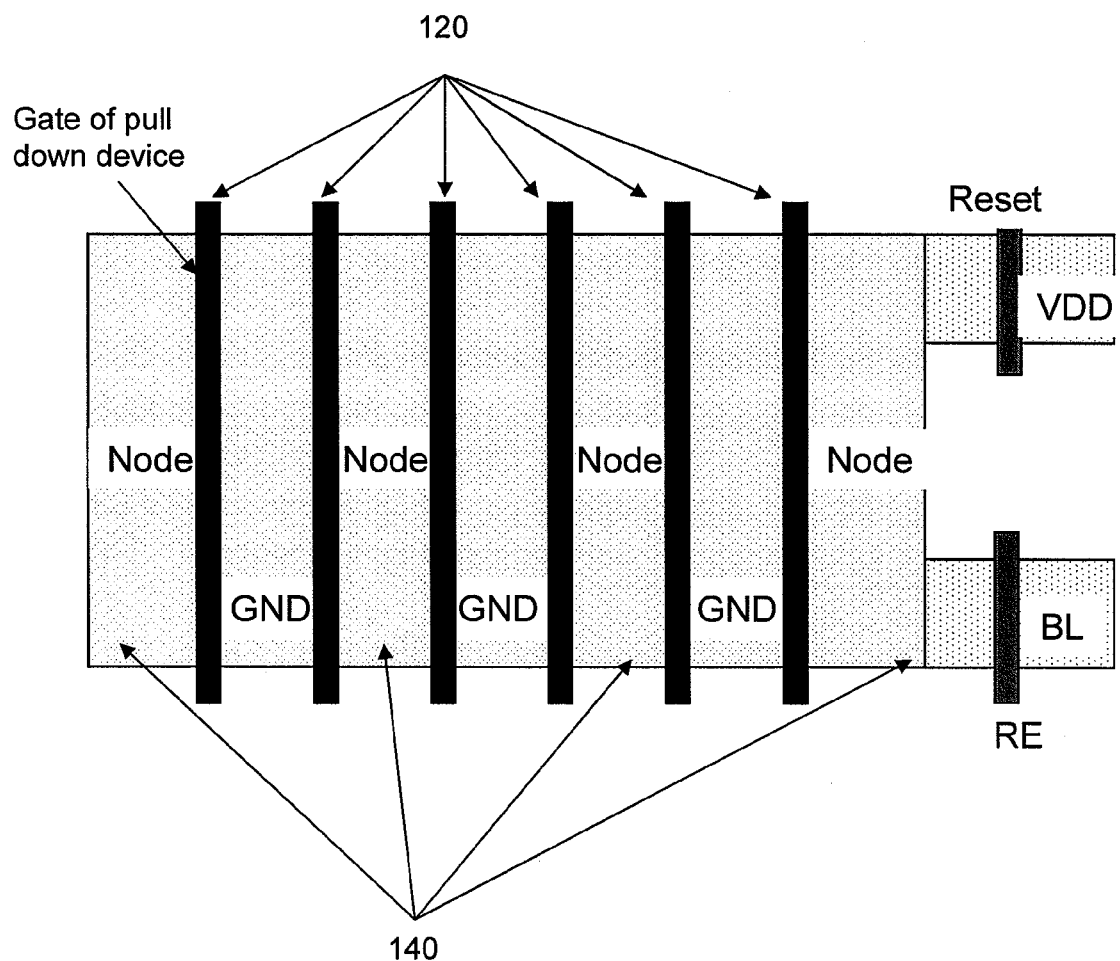
FIG. 2 shows a layout of the SOI radiation detector in accordance with the invention.

FIG. 2 shows a layout of the SOI radiation detector in accordance with the invention. To increase the sensitive area in each cell, multiple detector pulldown devices may be connected in parallel, since an event on any one of the detector pulldown devices will discharge the node. To increase the fraction of the sensor cell sensitive to radiation, the precharge and access device have a smaller gate width than the detector pulldown device(s).

In particular, the layout of the SOI detector of FIG. 2 shows six detector pulldown devices 120 in parallel. In FIG. 2, the radiation sensor is fabricated in an SOI wafer. Preferentially, the wafer has a very thick SOI layer (250 nm) to increase the charge collection volume. Preferentially, the source and drain implants do not extend to the BOX layer, so that holes generated in the source/drain diffusions are collected in the body, charging the body and causing a parasitic bipolar response.

As shown further in FIG. 2, the SOI radiation detector comprises the three transistors. The reset signal is used to charge the internal nodes 140, which are connected together via a metal wire (not shown). A radiation event on the detector pulldown device 120 discharges the node(s) 140. When the Read Enable signal is exercised, the access device writes the node state to the bitline (BL) (high indicates no event; low indicates a radiation event).

For SOI devices with thick SOI layer and source and drain implants that do not extend to the BOX, the body, source and drain serve as collection areas. SOI circuits can be designed with Qcrit of approximately 1 fC. Depending on their energy, alpha particles generate 4-13 fC/um in silicon, so the alpha particle path length through the SOI layer would need to be about 0.08-0.25 um. Having an SOI layer thickness of 0.25 um allows detection of alpha particles of any energy and angle that hits the sensitive region.

As an alternate embodiment, the precharge device consists of a PMOS transistor. Using a PMOS transistor charges NODE to Vdd, without the diode drop of an NMOS precharge device. A PMOS precharge transistor requires more area than an NMOS precharge transistor when placed in its own silicon island. The area penalty of a PMOS precharge transistor can be minimized by using butted junctions and mirroring sensors.

Figure 3:
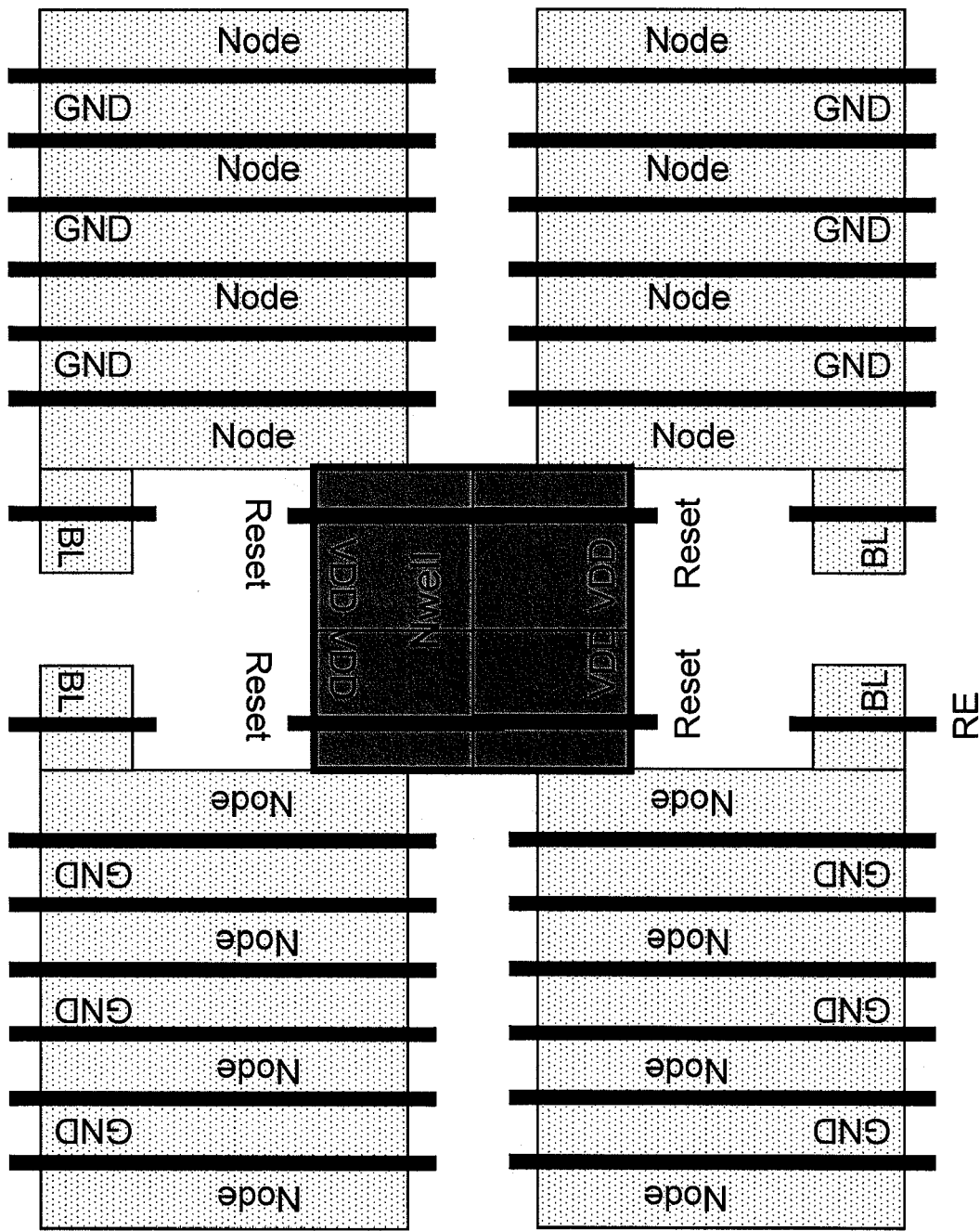
FIG. 3 shows a layout of four SOI radiation detectors in accordance with the invention.

FIG. 3. shows a layout of four SOI radiation detectors, each with six detector pulldown devices in parallel. The PMOS precharge devices are in a shared Nwell with their drains abutting drains of NMOS detector pulldown devices.

Design Structure

Figure 4:
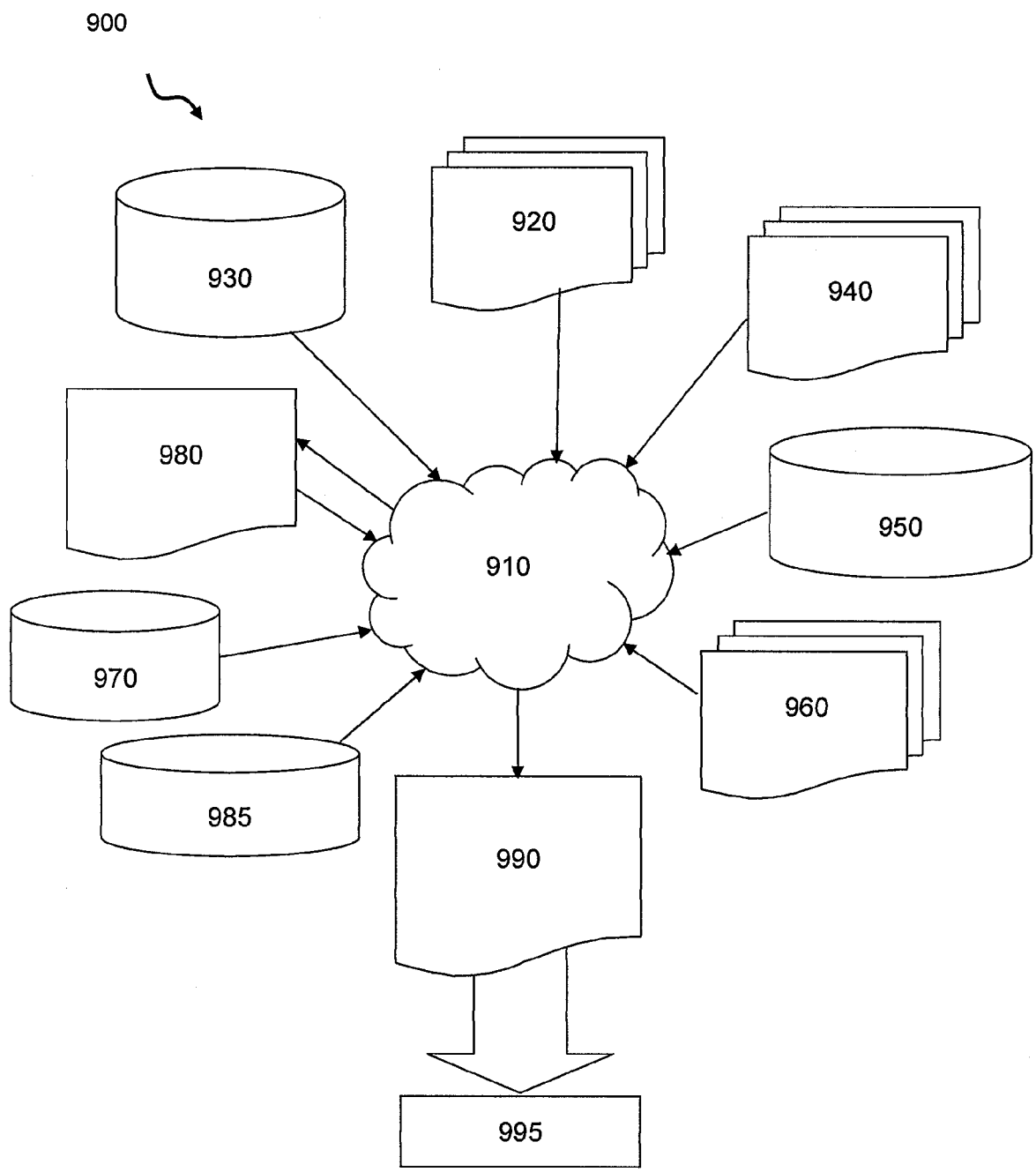
FIG. 4 is a flow diagram of a design process used in semiconductor design, manufacture, and/or test.

FIG. 4 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 1-3 in the form of schematics or HDL, a hardware-description language (e.g., Verilog, VHDL, C, etc.). Design structure 920 may be contained on one or more machine readable media. For example, design structure 920 may be a text file or a graphical representation of an embodiment of the invention as shown in FIGS. 1-3. Design process 910 preferably synthesizes (or translates) an embodiment of the invention as shown in FIGS. 1-3 into a netlist 980, where netlist 980 is, for example, a list of wires, transistors, logic gates, control circuits, I/O, models, etc. that describes the connections to other elements and circuits in an integrated circuit design and recorded on at least one of machine readable media. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 1-3, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-3. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of embodiments, those of skill in the art will recognize that the invention can be practiced with modifications and in the spirit and scope of the appended claims.

What is claimed is:

1. A silicon-on-insulator radiation detector, comprising:
   a charge collection node;
   a precharge transistor that has a source from the charge collection node, a drain at Vdd, and a gate controlled by a precharge signal;
   an access transistor that has a source from the charge collection node, a drain connecting to a readout node, and a gate controlled by a read-out signal; and
   a detector pulldown transistor having a drain from the charge collection node, a source to ground, and a grounded gate.

2. The silicon-on-insulator radiation detector of claim 1, further comprising a silicon layer formed on an insulating substrate, the silicon layer including shallow implanted regions that do not extend to the insulating substrate.

3. The silicon-on-insulator radiation detector of claim 1, wherein the detector pulldown transistor is a multi-finger detector pulldown transistor.

4. A silicon-on-insulator radiation detector comprising:
   a silicon layer formed on an insulating substrate, wherein the silicon layer includes shallow implanted regions that do not extend to the insulating substrate;
   a charge collection node;
   a precharge transistor of a first polarity whose source is the charge collection node, whose drain is at Vdd, and whose gate is controlled by a precharge signal
   an access transistor of a second polarity whose source is the charge collection node, whose drain connects to a readout node, and whose gate is controlled by a read-out signal; and
   a multi-finger detector pulldown transistor of a second polarity whose drain is the charge collection node, whose source is grounded, and whose gate is grounded.

5. A design structure embodied in a non-transitory computer usable storage medium for designing, manufacturing, or testing an integrated circuit, the design structure comprising:
   a charge collection node;
   a precharge transistor that has a source from the charge collection node, a drain at Vdd, and a gate controlled by a precharge signal;
   an access transistor that has a source from the charge collection node, a drain connecting to a readout node, and a gate controlled by a read-out signal; and
   a detector pulldown transistor having a drain from the charge collection node, a source to ground, and a grounded gate.

6. The design structure of claim 5, wherein the design structure comprises a netlist.

7. The design structure of claim 5, wherein the design structure resides on storage medium as a data format used for the exchange of layout data of integrated circuits.

8. The design structure of claim 5, wherein the design structure resides in a programmable gate array.

9. A silicon-on-insulator radiation detector comprising:
   a precharge NFET having a source from a charge collection node, a drain at Vdd, and a gate controlled by a precharge signal;
   multiple detector NFETs connected in parallel; and
   an access NFET having a source from the charge collection node, a drain connecting to a readout node, and a gate controlled by a read-out signal, wherein
   the charge collection node connects to the precharge NFET, the multiple detector NFETs and the access NFET.

10. The silicon-on-insulator radiation detector of claim 9, wherein the multiple detector NFETs are detector pulldown devices whose drain is the charge collection node, whose source is grounded, and whose gate is grounded.

11. The silicon-on-insulator radiation detector of claim 10, wherein the precharge NFET and access NFET have a smaller gate width than the detector pulldown devices to increase a fraction of sensor cell sensitive to radiation.

12. The silicon-on-insulator radiation detector of claim 10, wherein the PMOS precharge transistor is in a shared Nwell with drains abutting drains of the detector pulldown devices.

13. The silicon-on-insulator radiation detector of claim 9, wherein the precharge NFET is a reset device.

14. The silicon-on-insulator radiation detector of claim 9, wherein the multiple detector NFETs connected in parallel are six detector pulldown devices.

15. The silicon-on-insulator radiation detector of claim 9, wherein the precharge device consists of a PMOS precharge transistor.

16. The silicon-on-insulator radiation detector of claim 15, wherein an area penalty of a PMOS precharge transistor is minimized by butted junctions and mirroring sensors.

* * * * *